United States Patent
Lin

(12) 
(10) Patent No.: US 6,472,108 B1
(45) Date of Patent: Oct. 29, 2002

(54) OPTICAL PROXIMITY CORRECTION METHOD

(75) Inventor: Chin-Lung Lin, Hsinchu Hsien (TW)

(73) Assignee: United Microelectronics Corp., Hsinchu (TW)

( * ) Notice: Subject to any disclaimer, the term of this patent is extended or adjusted under 35 U.S.C. 154(b) by 36 days.

(21) Appl. No.: 09/686,433

(22) Filed: Oct. 10, 2000

(51) Int. Cl.[7] .................................................. G03F 9/00
(52) U.S. Cl. ............................................. 430/5; 430/30
(58) Field of Search ...................... 430/5, 30; 716/19, 716/21

(56) References Cited

U.S. PATENT DOCUMENTS 6,033,814 A * 3/2000 Burdorf et al. ............... 430/30

* cited by examiner

Primary Examiner—S. Rosasco
(74) Attorney, Agent, or Firm—Charles C.H. Wu; Wu & Cheng, LLP

(57) ABSTRACT

An optical proximity correction method. Assist features, such as scattering bars, are added to a main pattern to be transferred. Calculations are performed on the entire two-dimensional original pattern using model-based optical proximity correction. A series of features are added according to the specific reference indexes of the coordinate system. The original pattern is altered to form a corrected pattern. The process of calculation and correction, however, does not include the scattering bars.

14 Claims, 4 Drawing Sheets

OPTICAL PROXIMITY CORRECTION METHOD

BACKGROUND OF THE INVENTION

1. Field of the Invention

The present invention relates to an optical proximity correction method. More particularly, the present invention relates to an optical proximity correction method used on highly integrated devices with small critical dimension.

2. Description of the Related Art

As developments in circuit integration continue to proliferate, design trends will compel further reductions in device size and higher levels of device integration.

During manufacture, the photolithography process is one of the most decisive steps in determining the performance of an IC. Following a gradual increase in the level of circuit integration and a concomitant reduction in device size, problems have emerged related to pattern transfer deviation. These problems occur during photolithography.

For example, when a masking pattern is transferred to a wafer using photolithographic etching, the angles on the pattern become less sharp, the tail of the pattern shrinks, and line-width increases or decreases. This is what is known as the Optical Proximity Effect (OPE).

With larger devices or those that are less integrated, this deviation does not have an extremely adverse effect. However, this deviation has a critical effect on the performance of highly integrated devices. For example, on highly integrated ICs, distance between devices is small. Thus, when the line width of the pattern that has been transferred to the wafer expands, it is possible for patterns to partially overlap causing a short circuit. Enhancing the performance of ICs, that is to say, the improvements that can be gained corresponding to a reduction in device size, will gradually be constrained by the increasing lack of fidelity in the lithographic etching process.

The primary factors related to the formation of OPE are optical factors. These factors can include interference caused by light piercing two different patterns on the photomask, the reflection of light caused by an uneven substrate, as well as other factors related to manufacture of the photomask such as baking time, baking temperature and development. When the critical dimension decreases as the size of the pattern decreases, deviation caused by OPE during transfer will be even greater.

An optical proximity correction (OPC) procedure is often performed to prevent Critical Dimension Variation during the transfer of the photomask pattern. That is to say, a data computer and commercial software are used to measure and correct the original pattern exposed on the wafer of the semiconductor substrate. The resulting pattern is saved in a computer file. This pattern is then fabricated on the photomask. Thus, the patterns created as light penetrates the mask and is projected on the semiconductor substrate will be nearly the same as the original.

Optical Proximity Correction can be divided into rule-based Optical Proximity Correction and model-based Optical Proximity Correction. Rule-based OPC involves comparing the width of the original pattern that is to be transferred and the relative density of features to the correction standard saved in the database to perform correction. Model-based OPC primarily uses a simulator to conduct a series of complex corrective calculations according to the exposure result.

Rule-based OPC adds serifs to the corners or hammerheads to the edges of the original pattern. The width of the features of the original pattern to be transferred and the density of features on the pattern are compared to a reference table, established according to an obtained corrective standard. Based on this comparison assist features are added to perform the correction.

As shown in FIG. 1, a main pattern 100 to be transferred is provided, including rectangular region 100a, long narrow region 100b and the connected portions 100c and 100d. Serifs 110 are added to the main pattern 100. For example, serifs 110 are added to each of the corners of rectangular region 100a and long narrow region 100b. Depending on the circumstance (based on width and density), the line width of the original pattern is increased or decreased or assist features such as scattering bars 120 are added around the pattern.

Scattering bars are among the most commonly used assist features in the photolithography process. Scattering bars are added by forming bar-shaped openings on the periphery of the pattern on the photomask. When the pattern is exposed, light waves pass through the scattering bars so that the proximity effect on the original pattern is eliminated. Scattering bars can adjust the duty ratio between line width to achieve the best resolution.

The addition of serifs or hammerheads can reduce rounding of the corners and edges of the transfer pattern. The addition of assist features increases the pattern's contrast to achieve the best resolution and increase the process window.

In the model-based OPC method a test pattern is exposed. A correlation is made between the exposed result and the original pattern to be transferred. The degree of deviation between the two is used to decide whether or not to perform optical proximity correction OPC. The simulator is then used to calculate and determine the degree of correction, based on the degree of deviation. As shown in FIG. 2, a simulator is used to calculate and correct the exposure of the main pattern to be transferred in FIG. 1 result to achieve corrected pattern 200. Corrected pattern 200 includes rectangular area 200a, long narrow area 200b, and the connected areas 200c and 200d. The simulator is used to perform comprehensive calculations on the two dimensional pattern based on the specific reference indexes of the coordinate system. According to the calculations, a series of features are added. The shape of the original pattern is thus changed to adjust for the error that may occur during pattern transfer. Moreover, the process of calculation is repeated several times. Thus, the accuracy of the model-based OPC method is very high. However, the assist features of this method do not include scattering bars. Consequently, the processing window of this method cannot be increased.

SUMMARY OF THE INVENTION

The primary object of this method is to provide an optical correction method that uses a model-based OPC approach suited for use with assist features, such as scattering bars, which is able to increase the processing window and maintain accuracy.

Another object of this invention is to provide an optical proximity correction method that can be used to correct the photomask design of highly integrated devices with low critical dimension.

As embodied and broadly described herein, the invention first provides a layout pattern to be transferred. Assist features, such as scattering bars, are added to the layout pattern where the critical dimension is smaller than the wavelength of the exposed light source. Using a model-based optical proximity correction method, the simulator is used to perform calculations on the entire original two-dimensional pattern. The scattering bars are not included in this calculation and correction, however. A photomask is formed according to the calculation result. Exposure and other steps of the photolithography process are conducted.

According to the object of this invention, the use of optical proximity correction and the assist features added to the main pattern to be transferred can increase the pattern's contrast achieving the highest resolution and can increase the processing window. The calculations and corrections using the simulator to perform model-based OPC also enhance accuracy.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention, and, together with the description, serve to explain the principles of the invention. In the drawings.

DESCRIPTION OF THE PREFERRED EMBODIMENTS

Figure 1:
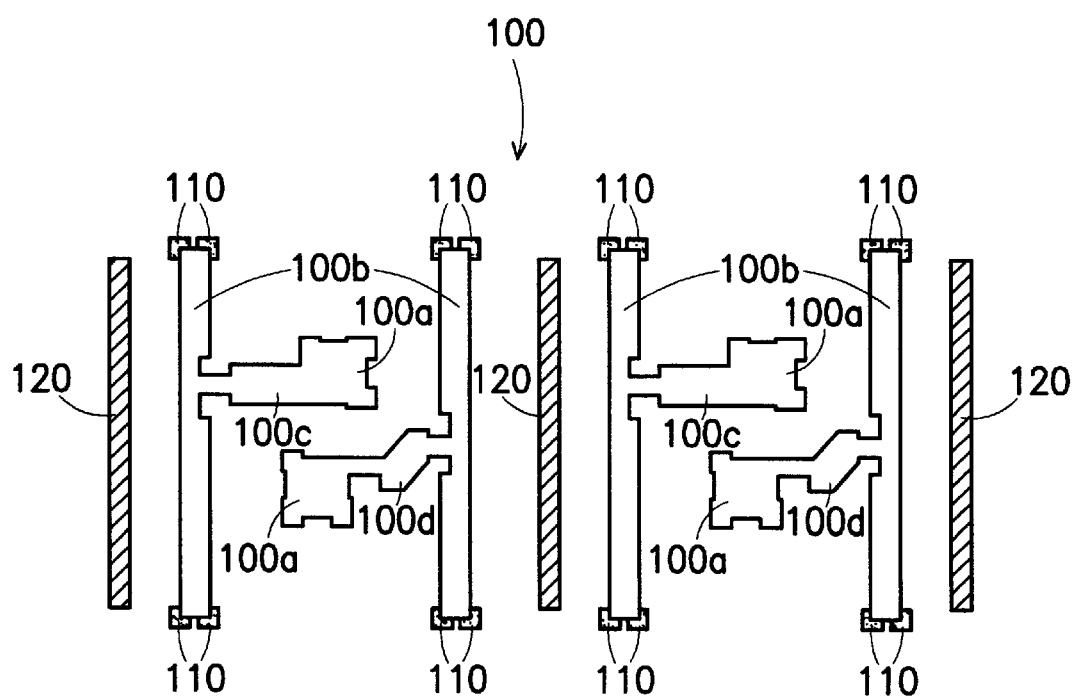
FIG. 1 illustrates the prior art, showing a pattern that has been corrected using a rule-based optical proximity correction (Rule-based OPC) method.
Figure 2:
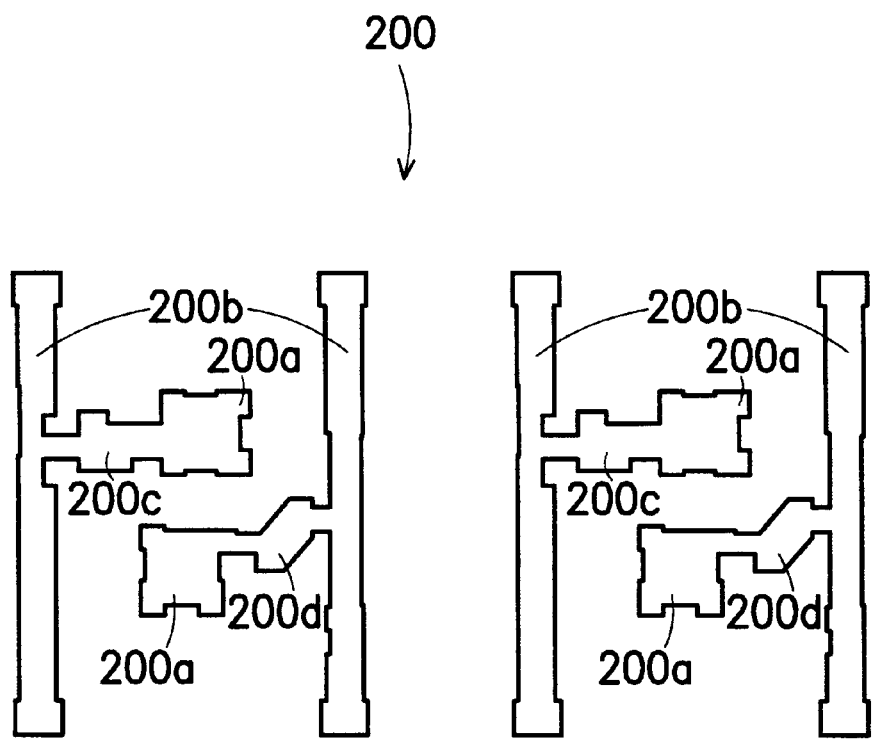
FIG. 2 illustrates the prior art, showing a pattern that has been corrected using a model-based optical proximity correction (Model-based OPC) method.

Reference will now be made in detail to the present preferred embodiments of the invention, examples of which are illustrated in the accompanying drawings. Wherever possible, the same reference numbers are used in the drawings and the description to refer to the same or like parts.

Generally, the items used in the photolithography step include a reticle (i.e. mask). The reticle has a pattern that corresponds to a pattern on a layer of an integrated circuit. Often, the reticle includes a glass plate with a patterned layer that is impervious to light, such as a chromium layer.

During exposure, the reticle is placed between the wafer and the light source. When a light source projects on the reticle, light passes the glass plate uncovered by the opaque layer and then projects on a photomask above the wafer. In this way, the pattern on the reticle is transferred to the photo-resist layer.

Refraction or interference that is created as a light beam penetrates the reticle, in addition to other factors in the process of manufacture, can cause the transferred pattern to be altered during exposure. In order to reduce alteration of the pattern and assure fidelity, this invention provides a method that utilizes a model-based optical proximity correction method with assist features, such as scattering bars, to correct the optical proximity effect and achieve the highest fidelity.

Figure 3:
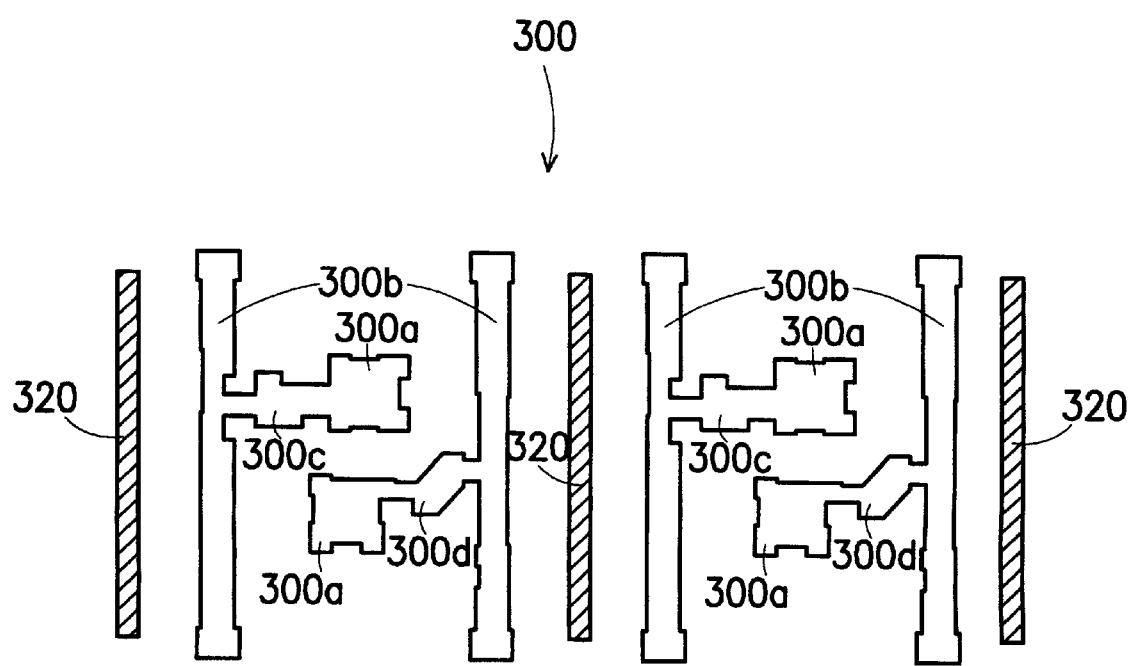
FIG. 3 illustrates a pattern that has been corrected using an optical proximity correction method according to one preferred embodiment of the invention.

As shown in FIG. 3, a simulator is used to calculate and correct the main pattern to be transferred of FIG. 1, based on the optical proximity correction method of this invention to achieve corrected pattern 300. Corrected pattern 300 includes rectangular portion 300a, long narrow portion 300b, and connected portions 300c and 300d.

A layout pattern, also known as main pattern, is provided. When the width of a feature of the main pattern to be transferred is smaller than the wave-length of light, assist features are added to the layout pattern. For example in the case of ultra-violet light with a wave-length of 248 nm and line-width or the width of a feature is smaller 0.18 gm, scattering bars 320 can be added to the periphery of the layout pattern. In this case, the width of the scattering bars can be, for example, approximately 50–90 nm. In the case of ultraviolet light with a wavelength of 193 nm, scattering bars with a width of about 30–70 nm can be added. The assist features, such as scattering bars, and the layout pattern can be defined as a same layer type, or alternatively, as a different layer type.

The addition of scattering bars increases the pattern's contrast, increases the degree of resolution, and raises the processing window.

Because the method of this invention increases resolution it can be used on masks designed with even smaller line widths, for example 0.15 sub-microns or less. This invention can be used on binary masks or phase shift masks. However, it is more suitable for phase shift masks.

A simulator is used to perform calculations on the original, two-dimensional pattern based on the specific reference indexes of the coordinate system. According to these calculations a series of features are added to change the shape of the original pattern so as to form corrected pattern 300. However, the assist features, such as scattering bars, are not included in the process of calculation and correction.

Figure 4:
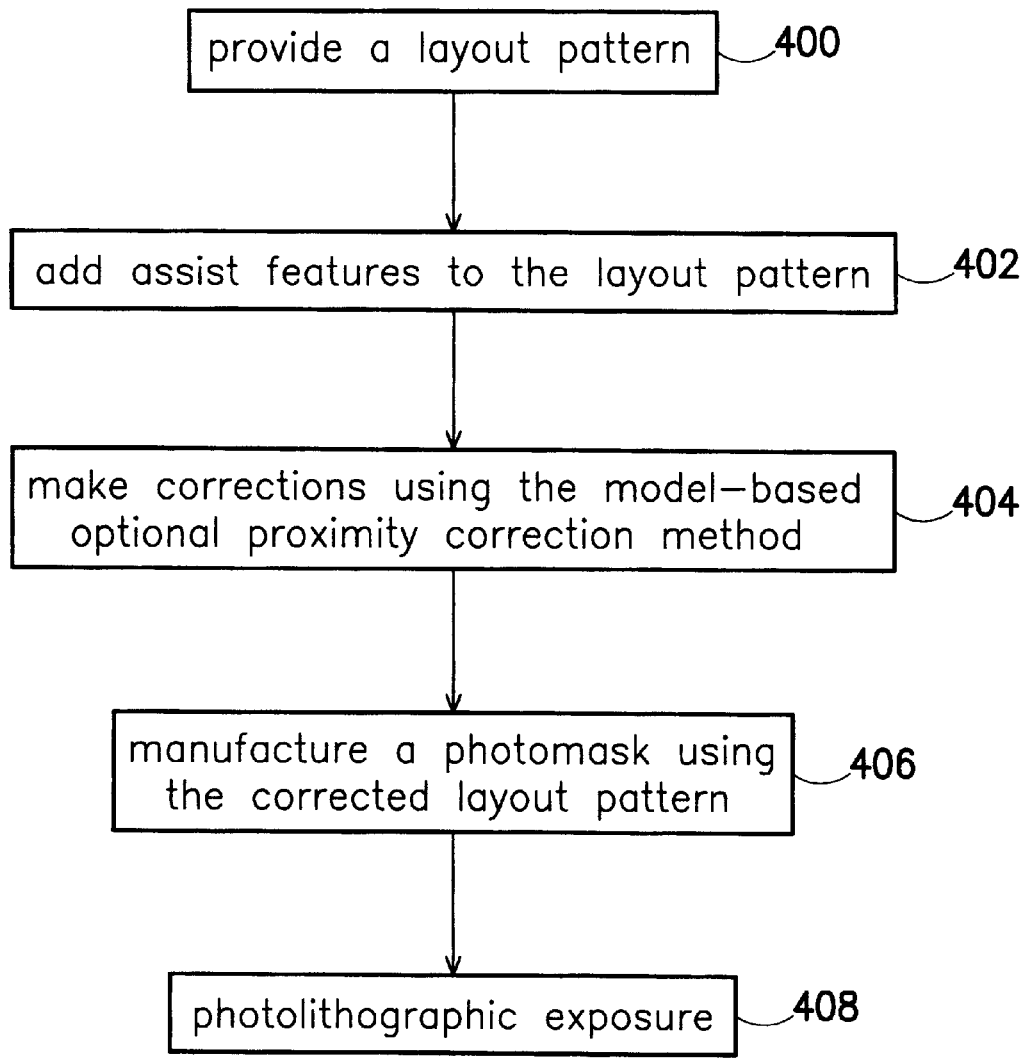
FIG. 4 is a flowchart of the optical proximity correction method according to one preferred embodiment of this invention.

FIG. 4 shows the processing steps of this invention. In step 400, a layout pattern to be transferred is provided. In step 402, assist features, for example scattering bars, are added to the area of the layout pattern where the line-width is less than the wave-length of the light source. In step 404, the model-based optical proximity correction method is used along with a simulator to calculate and correct the entire original two-dimensional pattern. The assist features such as scattering bars are, however, not included in the process of calculation and correction. In step 406, a photomask is manufactured using the main pattern that has been corrected. In step 408, exposure and other steps in the photolithographic are conducted using the photomask.

According to the object of this invention, the use of optical proximity correction and the assist features, such as scattering bars, added to the main pattern to be transferred can increase the pattern's contrast achieving the highest resolution and can increase the processing window. The calculations and corrections using the simulator to perform model-based optical proximity correction also maintain accuracy.

The benefits of this invention include a concern for high resolution and accuracy. It also is a method that can be used to correct the photo-masks on highly-integrated circuits with low critical dimension.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An optical proximity correction method comprising the steps of:
   providing a layout pattern having at least a feature;
   inspecting each feature's line width;
   adding an assist feature to those features on the layout pattern whose line width is smaller than the wavelength of a light source used for exposure; and
   calculating and correcting the layout pattern to which assist features have been added, using a model-based optical proximity correction method, wherein calculations and corrections using the model-based optical proximity correction method are performed on the layout pattern but not on the assist features.

2. The method of claim 1, wherein calculations and corrections using the model-based optical proximity correction method are performed on the layout pattern but not on the assist features.

3. The method of claim 1, wherein the assist features and the layout pattern are defined as a same layer type.

4. The method of claim 1, wherein the assist features and the layout pattern are defined as a different layer type.

5. The method of claim 1, wherein the step of calculating and correcting the layout pattern to which assist features have been added, using the model-based optical proximity correction method includes:
   inspecting each part of the layout pattern according to a coordinate system of a simulator to obtain reference indexes for each part;
   determining sizes and locations of the corrections to be made to the layout pattern according to the reference indexes of each part of the layout pattern; and
   completing calculations and corrections of the layout pattern.

6. A method for designing a photomask using a simulator comprising:
   providing a layout pattern having at least a feature;
   inspecting each feature's line width;
   adding an assist feature to those features on the layout pattern whose line width is smaller than the wavelength of a light source used for exposure;
   calculating and correcting the layout pattern to which assist features have been added, using the model-based optical proximity correction method, wherein calculations and corrections using the model-based optical proximity method are performed are performed on the layout pattern but not on the assist features; and
   manufacturing a photomask using the corrected layout pattern.

7. The method of claim 1, further comprising manufacture of a photomask, after the step of calculating and correcting the layout pattern using the model-based optical proximity correction method.

8. A method for designing a photomask using a simulator comprising:
   providing a layout pattern having at least one feature;
   inspecting a line width of each feature;
   adding assist features to each features on the layout pattern whose line width is smaller than the wavelength of a light source used for exposure;
   calculating and correcting the layout pattern to which assist features have been added, using the model-based optical proximity correction method; and
   manufacturing a photomask using the corrected layout pattern.

9. The method of claim 8, wherein calculations and corrections using the model-based optical proximity method are performed are on the layout pattern but not on the assist features.

10. The method of claim 8, wherein the assist feature is a scattering bar.

11. The method of claim 8, wherein the assist features and the layout pattern are defined as a same layer type.

12. The method of claim 8, wherein the assist features and the layout pattern are defined as a different layer type. bar.

13. The method of claim 8, wherein the step of calculating and correcting the layout pattern to which assist features have been added, using the model-based optical proximity correction method includes:
   inspecting each part of the layout pattern according to a coordinate system of a simulator to obtain reference indexes of each part;
   determining the sizes and locations of the corrections to be made to the layout pattern according to the reference indexes of each part of the layout pattern; and
   completing calculations and corrections of the layout pattern.

14. The method of claim 8, wherein the assist feature includes a scattering.

* * * * *